United States Patent
Wiltzius et al.

(10) Patent No.: US 11,847,002 B2
(45) Date of Patent: Dec. 19, 2023

(54) EXPELLING AIR FROM A COMPUTER ENCLOSURE

(71) Applicant: Hewlett-Packard Development Company, L.P., Spring, TX (US)

(72) Inventors: Andrew Wiltzius, Fort Collins, CO (US); Robert Crane, Fort Collins, CO (US); Heather Burnam Volesky, Fort Collins, CO (US); Julie Duke, Fort Collins, CO (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 66 days.

(21) Appl. No.: 17/416,721

(22) PCT Filed: May 21, 2019

(86) PCT No.: PCT/US2019/033412
§ 371 (c)(1),
(2) Date: Jun. 21, 2021

(87) PCT Pub. No.: WO2020/236161
PCT Pub. Date: Nov. 26, 2020

(65) Prior Publication Data
US 2022/0066523 A1  Mar. 3, 2022

(51) Int. Cl.
G06F 1/20 (2006.01)
G06F 1/18 (2006.01)
H05K 7/20 (2006.01)

(52) U.S. Cl.
CPC ............... *G06F 1/20* (2013.01); *G06F 1/181* (2013.01); *H05K 7/20145* (2013.01)

(58) Field of Classification Search
CPC . G06F 1/20; G06F 1/181; G06F 1/184; G06F 2200/201; G06F 1/183; G06F 1/185; G06F 1/16; H05K 7/20727; H05K 7/20145; H05K 7/20809; H05K 5/0213
See application file for complete search history.

(56) References Cited

U.S. PATENT DOCUMENTS

| 5,432,674 | A | 7/1995 | Hardt |
| 6,061,237 | A | 5/2000 | Sands et al. |
| 6,538,903 | B1 * | 3/2003 | Radu ..................... H05K 9/0041 |
| | | | 439/607.41 |
| 6,599,090 | B2 * | 7/2003 | Ozaki ..................... G06F 1/203 |
| | | | 415/206 |

(Continued)

FOREIGN PATENT DOCUMENTS

WO   WO-2018070990 A1   4/2018

*Primary Examiner* — Mandeep S Buttar
(74) *Attorney, Agent, or Firm* — Knobbe, Martens, Olson & Bear, LLP (57) ABSTRACT

In an example implementation, a computer assembly includes a computer enclosure, a motherboard with an inset edge section that forms a motherboard air gap between the motherboard and a rear wall of the enclosure when the motherboard is installed in the enclosure, a vent opening formed in the enclosure below the motherboard, and an air mover to draw air from above the motherboard, through the air gap, and below the motherboard, and to expel the air drawn below the motherboard from the enclosure through the vent opening.

15 Claims, 5 Drawing Sheets

(56) References Cited

U.S. PATENT DOCUMENTS

| | | | |
|---|---|---|---|
| 6,801,430 B1* | 10/2004 | Pokharna | H05K 1/0203 |
| | | | 361/720 |
| 7,161,093 B1* | 1/2007 | Hsieh | H05K 7/1417 |
| | | | 361/752 |
| 7,167,363 B1* | 1/2007 | Cushman | H05K 7/20145 |
| | | | 361/692 |
| 7,558,061 B2 | 7/2009 | Franz et al. | |
| 7,957,140 B2* | 6/2011 | Mongia | G06F 1/203 |
| | | | 165/104.33 |
| 8,848,364 B2* | 9/2014 | Crane | G06F 1/20 |
| | | | 361/679.51 |
| 9,795,055 B1 | 10/2017 | Campbell et al. | |
| 9,851,766 B2* | 12/2017 | Mongia | G06F 1/203 |
| 10,165,705 B2 | 12/2018 | Varadarajan et al. | |
| 2004/0125558 A1* | 7/2004 | DiStefano | G06F 1/203 |
| | | | 361/679.48 |
| 2008/0151491 A1 | 6/2008 | Baldwin et al. | |
| 2013/0141865 A1 | 6/2013 | Wu et al. | |
| 2015/0234437 A1 | 8/2015 | Gallina et al. | |
| 2016/0278236 A1 | 9/2016 | Mitsui | |
| 2017/0086332 A1 | 3/2017 | Jaskela et al. | |

* cited by examiner

EXPELLING AIR FROM A COMPUTER ENCLOSURE

BACKGROUND

Most computer systems, including desktop computer systems, can be upgraded by installing expansion cards, such as PCIe (peripheral component interconnect express) cards. PCIe cards can be installed to improve the performance of a computer system in a number of ways. For example, computers used for gaming often include an added video/graphics expansion card that improves the video performance of the computer. PCIe cards can be installed into expansion slots on a motherboard PCA (printed circuit assembly) within most computer enclosures, or chassis. In some examples, multiple expansion cards can be packed together in close proximity to one another within a computer chassis. Expansion cards generally comprise a printed circuit board (PCB) with a number of electronic components mounted to the board. During operation, these and other system components can generate a large amount of heat. To help ensure reliable operation of the computer system, heat generated by these components can be transferred out of the system.

BRIEF DESCRIPTION OF THE DRAWINGS

Examples will now be described with reference to the accompanying drawings, in which.

Throughout the drawings, identical reference numbers designate similar, but not necessarily identical, elements.

DETAILED DESCRIPTION

Most computer systems enable system upgrades through the installation of expansion cards, such as PCIe (peripheral component interconnect express) cards. Without such upgrades, the continued evolution of software applications that run on a computer system can cause the system to begin slowing down and eventually become obsolete. In addition, such upgrades can extend the features of a computer system and/or provide additional features not previously available on the system.

A variety of expansion cards can be installed in a computer, including sound cards, network cards, modem cards, interface cards, video cards (also referred to as graphics cards), and others. An expansion card can be installed in a computer by inserting the card into an expansion card slot located on the motherboard, such as a PCI (peripheral component interconnect) slot, an AGP (accelerated graphics port), or a PCIe slot. A motherboard, or motherboard PCA, generally refers to the main computer system printed circuit board that can include the central processing unit(s), the memory controller and input/output chipsets, the interface connectors (e.g., expansion slots) for installing expansion cards and memory cards such as DIMMs (dual inline memory modules), and other components.

While some computers can have different types of expansion slots, the PCIe slot has become the interface that is used in most computers. Accordingly, most motherboards currently manufactured comprise PCIe slots, exclusively. However, while the present description may refer primarily to PCIe slots, PCIe cards, and the like, there is no intent to limit the types of slots and/or cards to which the description may apply. Thus, references made in this description to PCIe slots, PCIe cards, expansion slots, expansion cards, and the like, are intended to refer generally to any appropriate respective type of expansion slot or expansion card.

A computer enclosure, often referred to as a computer chassis, generally includes most of the components of the computer, such as the motherboard, the expansion cards, the disk drives, a power supply, a cooling system, and so on. While computer enclosures can come in many different sizes and shapes, the size and shape of a given enclosure is often designed to accommodate the form factor of the motherboard to be installed within the enclosure. Regardless of the type of motherboard used (e.g., ATX motherboard; BTX motherboard) in the system, however, current motherboards extend all the way to the rear wall of the computer enclosure (chassis). Therefore, when PCIe expansion cards are installed on the motherboard, there is very little room for any air to escape from around the PCIe region of the motherboard. Because PCIe cards can generate considerable heat, the inability for air to escape from around the PCIe region presents a significant challenge when trying to expel heated air from the computer enclosure and keep the system cool.

The cooling of PCIe expansion cards has become increasingly more challenging as their use of power increases. For example, many high-end video and graphics cards can consume up to 300 watts, generating large amounts of heat. In addition, some computer systems can support multiple cards. While PCIe cards often have integrated cooling fans/blowers and venting in their rear bulkheads that allows heated air to leave the system enclosure, a significant amount of the heated air still ends up being released within the enclosure. For most computer systems, this "pre-heated" air is intended to be managed (i.e., expelled from the enclosure) by the system-level cooling solution, such as by the chassis exhaust fans. Instead, however, much of the pre-heated air is often recirculated within the enclosure. For example, the pre-heated air can be recirculated back over the top side of the motherboard, back into the PCIe card fan/blower inlets, and over and around other components and devices within the system. This recirculation of pre-heated air can heat up and adversely affect the components on the motherboard, other components and devices within the system, as well as the PCIe cards themselves. The adverse effects can include, for example, reduced system performance and a reduced system lifetime.

Prior solutions for improving the cooling of PCIe cards and expelling heated air from within computer enclosures have included providing additional air movers (fans, blowers, etc.) in the expansion slots next to the cards that are generating a lot of heat. While this provides some benefit, it comes at the cost of reducing the number of PCIe expansion slots available for use within the system. Other solutions have included providing additional air movers in the region above the PCIe cards, which can exhaust hot air out of the side panel of the enclosure or the rear of the enclosure, or both. Again, while there is some benefit to this solution, it comes at the cost of taking away space within the enclosure above the PCIe cards that is often used for special cabling and interconnects, such as NVLink, stereo, USB-C, VR goggles, and more. Still other solutions have included the use of liquid cooling to transport heat generated by the PCIe cards to another location within the system where it is easier to manage. This type of solution, however, is often accompanied by high costs, increased complexity, reliability issues, and difficulties replacing defective components associated with the solution.

Accordingly, example computer assemblies and related methods described herein help to expel heated air from a computer assembly enclosure (chassis) by pulling heated air away from the PCIe card region (and elsewhere) and under the computer motherboard. An air mover draws this heated air under the motherboard through a motherboard air gap, and expels it from the computer enclosure through added vents in the rear and/or bottom of the enclosure. Thus, an example computer assembly includes a motherboard with an inset section along its rear edge that creates an air gap between the motherboard and the rear wall of the computer enclosure. The enclosure includes additional vent openings that can be formed in the rear wall of the enclosure below the motherboard, and/or in the bottom wall of the enclosure below the motherboard. An air mover such as a centrifugal fan can be located under the motherboard, for example, and can draw heated air from above the motherboard (e.g., heated air from the PCIe cards), through the motherboard air gap, and underneath the motherboard. The air mover then further exhausts the heated air from below the motherboard to the outside of the computer enclosure through the additional vent openings in the rear wall and/or bottom wall of the enclosure. In some examples, a seal such as a gasket or rubber bumper, can be included around the motherboard and/or the air mover. The seal can help prevent heated air drawn below the motherboard from escaping back above the motherboard into other areas of the computer assembly enclosure. Removing heated air away from the PCIe card region and expelling it from the computer enclosure in this manner reduces the amount of heated air that gets recirculated within the system. This benefits the computer system both thermally and acoustically as system cooling fans do not have to run as fast to cool components and devices in the system.

In a particular example, a computer assembly includes a computer enclosure and a motherboard installed in the enclosure. The motherboard has an inset edge section that forms a motherboard air gap between the motherboard and the rear wall of the enclosure. The assembly includes a vent opening or openings formed in the enclosure below the motherboard, and an air mover to draw air from above the motherboard, through the air gap, and below the motherboard. The air mover is to further expel the air drawn below the motherboard out of the enclosure through the vent opening.

In another example, a method of expelling air from a computer assembly includes providing a motherboard within a computer enclosure, and providing an air gap between the motherboard and a rear wall of the computer enclosure. The method includes drawing air from a top side of the motherboard, through the air gap, to a bottom side of the motherboard, and then expelling the air drawn to the bottom side of the motherboard from the computer enclosure through an outlet vent formed in the computer enclosure below the motherboard.

In another example, a computer assembly includes a computer chassis to contain computer components including a motherboard. The assembly includes an air gap between the motherboard and a rear wall of the chassis fashioned by an inset section of the motherboard. An air mover located underneath the motherboard is to draw air from above the motherboard, through the air gap, below the motherboard, and out of the chassis through a chassis outlet vent located below the motherboard. In some examples, an assembly includes a seal to prevent the air drawn below the motherboard from escaping back above the motherboard.

Figure 1:
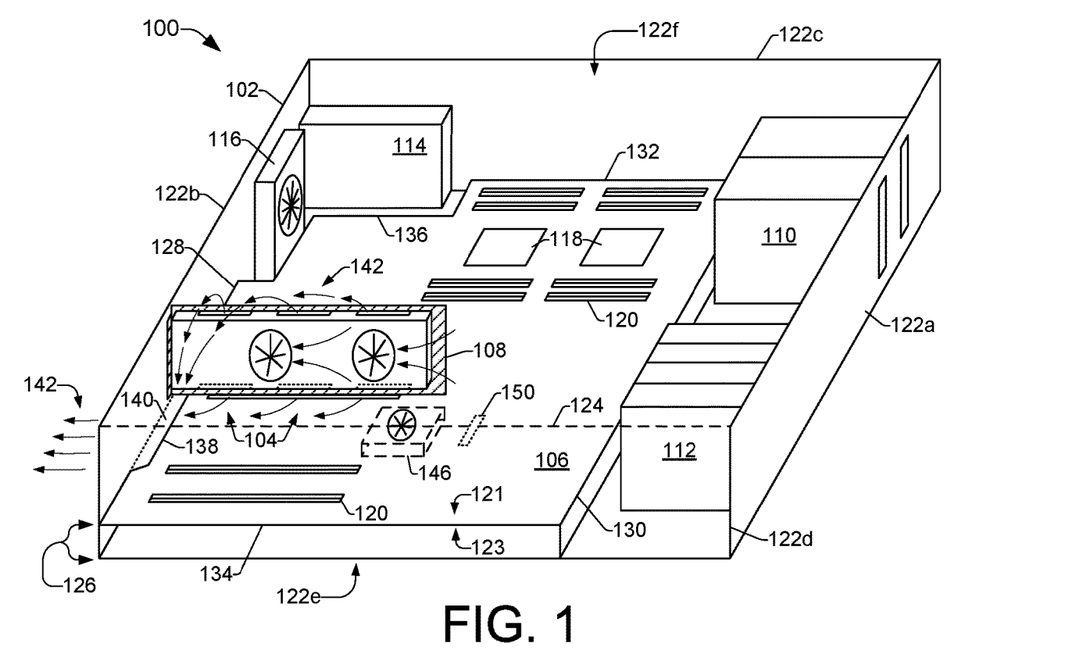
FIG. 1 shows a perspective view of an example computer assembly that can expel heated air from a computer enclosure by pulling heated air away from an expansion card region and under the computer motherboard.
Figure 2:
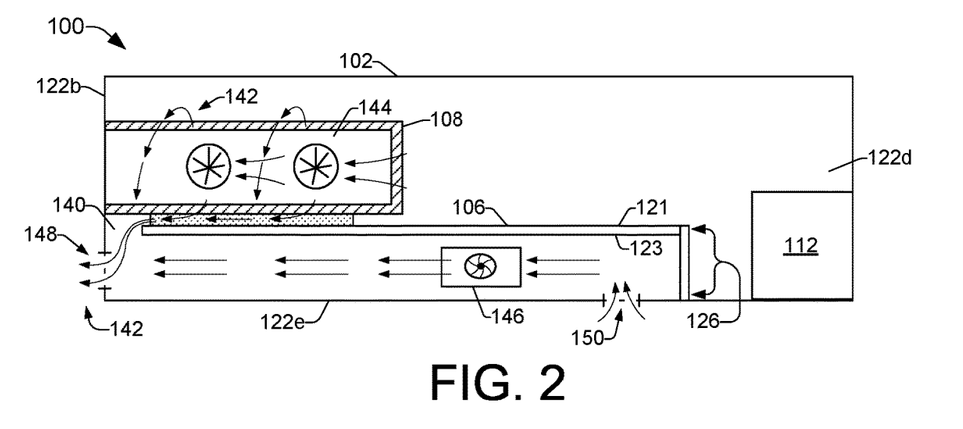
FIG. 2 shows a corresponding side view of the example computer assembly of FIG. 1.

FIG. 1 shows a perspective view of an example computer assembly 100 that can expel heated air from a computer enclosure (chassis) 102 by pulling heated air away from the PCIe card region 104 and under the computer motherboard 106. FIG. 2 shows a corresponding side view of the example computer assembly 100 of FIG. 1. Referring generally to FIGS. 1 and 2, an example computer enclosure 102 can contain most of the components of a computer system including, for example, the motherboard 106, PCIe and/or other types of expansion cards 108, disk drives 110 for CDs and DVDS, hard drives 112, a power supply 114, a cooling system exhaust fan 116 to help remove heat from the enclosure 102, and interconnect and power cables (not shown). The motherboard 106 comprises the main printed circuit assembly in a computer system, and it can include, for example, the central processing unit(s) 118, memory controller and input/output chipsets (not shown), expansion slots 120 and other interface connectors for installing expansion cards and memory cards such as DIMMs (not shown), and other components such as heat sinks for cooling the processors 118. These components and devices are generally located on the component surface, or top surface 121 of the motherboard 106, as opposed to the bottom surface 123 of the motherboard 106. Computer systems often additionally include input devices such as a keyboard and a mouse (not shown), and output devices such as a monitor to display information and a speaker to output audio information (not shown).

The example computer enclosure 102 shown in the example computer assembly 100 in FIGS. 1 and 2, comprises six walls (122*a*, 122*b*, 122*c*, 122*d*, 122*e*, 122*f*) that form a space or volume in which components of a computer system can be installed and housed. In this example, the six walls can be referred to as a front wall 122*a*, a rear wall 122*b*, a top wall 122*c*, a bottom wall 122*d*, a first side wall 122*e*, and a second side wall 122*f*. For the sake of simplifying the description and providing a better view of the enclosure 102 and various components housed within the enclosure 102, the bottom wall 122*d* and second side wall 122*f* are shown in transparency (distinguished by a dashed line 124). In addition, the computer enclosure 102 is shown in FIGS. 1 and 2 with its first side wall 122*e* facing downward. However, during operation, the computer enclosure 102 can be placed in an upright or standing position with the bottom wall 122*d* facing downward and the top wall 122*c* facing upward.

Referring still to the example computer assembly 100 of FIGS. 1 and 2, in some examples the motherboard 106 can have, in general, a rear edge 128, a front edge 130, a top side edge 132, and a bottom side edge 134. These edges may be considered to be the main edges of the motherboard 106, and they can correspond with or be aligned with particular walls of the computer enclosure 102 when the motherboard 106 is installed in the enclosure 102. For example, as shown in FIGS. 1 and 2, upon installation of the motherboard 106 into the enclosure 102, the rear edge 128 of the motherboard 106 corresponds with the rear wall 122b, the front edge 130 corresponds with the front wall 122a, and so on. Furthermore, the rear edge 128 of the motherboard 106 can extend all the way back to the rear wall 122b of the enclosure 102. In addition to these main edges, the motherboard 106 often has other minor edges 136, as can be seen in FIG. 1. Thus, this description is not intended to limit the motherboard to being a particular shape, such as a rectangular shape, for example. Instead, in different example computer assemblies, the motherboard 106 may have different shapes and sizes, and this description is intended to indicate that some of its main edges can correspond with or align with particular walls of a computer enclosure in which the motherboard is installed. Furthermore, as shown in FIGS. 1 and 2, when the motherboard 106 is installed within the computer enclosure 102, it can be located within the enclosure 102 such that its bottom surface 123 faces the surface of a side wall 122e across a small space 126 underneath the motherboard 106.

Referring still to the example computer assembly 100 of FIGS. 1 and 2, the example motherboard 106 includes an inset edge section 138 located along the rear edge 128 of the motherboard 106. In some examples, the rear edge of the motherboard can be inset on the order of between 4-6 mm. Therefore, while the rear edge 128 of the motherboard 106 extends all the way back to the rear wall 122b of the enclosure 102, the inset edge section 138 of the motherboard 106 creates an air gap 140 between the motherboard 106 and rear wall 122b. The air gap 140 allows heated air 142 from the PCIe card region 104 above the motherboard 106 to be drawn down under the motherboard 106. In general, a PCIe card 108 can have an integrated cooling system 144 that can have intake fans or blowers to move air through a cooling compartment and over the surface of the PCIe card. The air moving over the PCIe card 108 becomes heated air 142, and it can pass through openings in the cooling compartment and into the general PCIe card region 104. This heated air 142 can be drawn from above the motherboard 106, down under the motherboard by an air mover 146, such as air mover 146 located underneath the motherboard 106.

Figure 3:
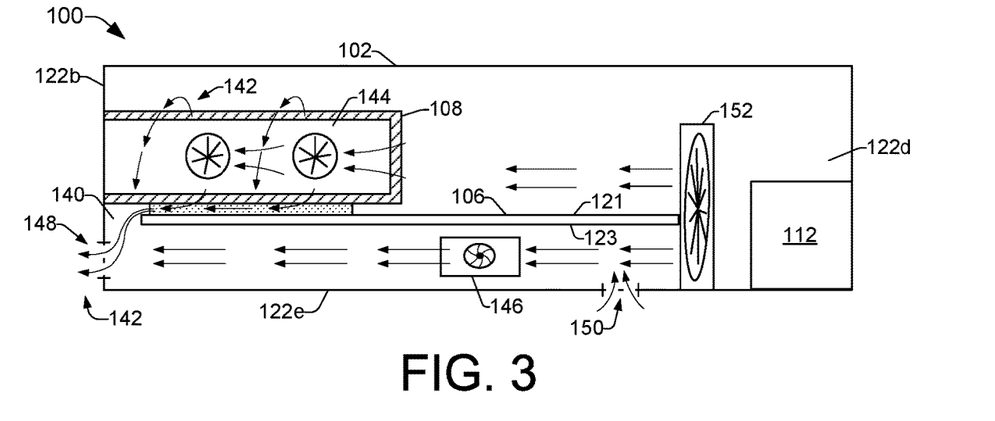
FIG. 3 shows an example of an air mover positioned to move air over both the top of a motherboard and underneath the motherboard.
Figure 8:
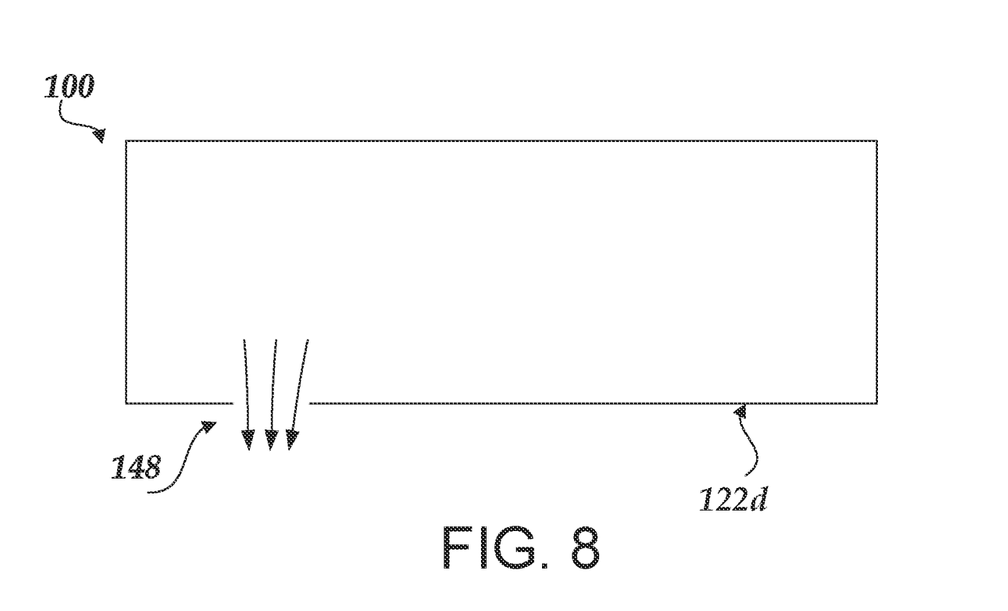
FIG. 8 schematically illustrates an outlet vent in a bottom wall of the computer assembly.

Heated air 142 that is drawn under the motherboard 106 by an air mover 146 can be expelled from the enclosure 102 through an additional outlet vent 148 located in the rear wall 122b of the enclosure 102 and below the motherboard 106. In some examples, an outlet vent 148 can be located in the bottom wall 122d under the motherboard 106. See FIG. 8. In some examples, an inlet vent 150 (e.g., FIG. 2) can be located in a wall of the enclosure to enable air flow under the motherboard 106 that draws heated air 142 under the motherboard and out of the enclosure through an outlet vent 148. In some examples, an air mover 146 to move air underneath the motherboard 106 and draw heated air 142 below the motherboard 106, can be located in different positions. As shown in FIG. 3, for example, an air mover 152 is positioned so that it moves air over both the top of the motherboard 106, and underneath the motherboard 106.

Figure 4:
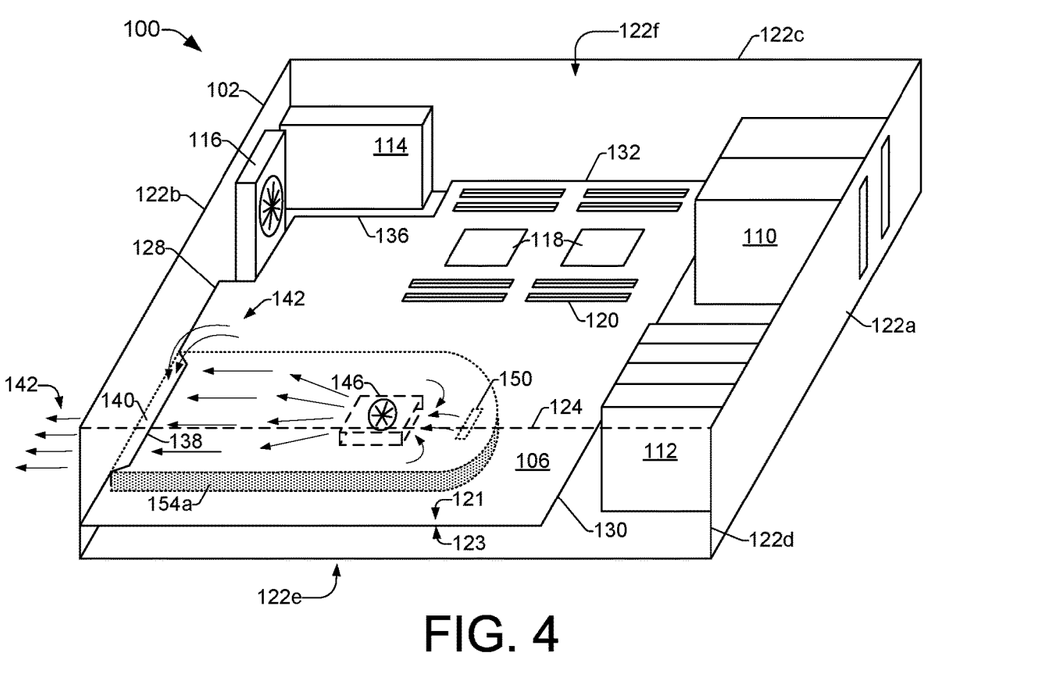
FIGS. 4 and 5 each show a perspective view of an example computer assembly, where air seals have been provided to prevent heated air drawn under the motherboard from returning back above the motherboard and being recirculated.
Figure 5:
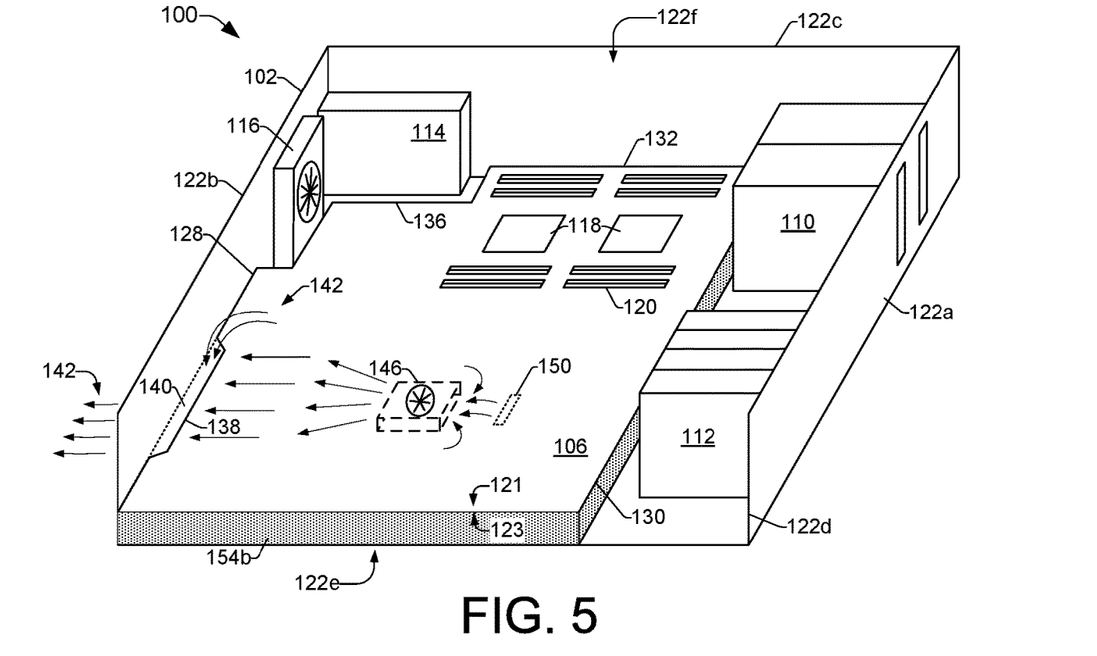

FIGS. 4 and 5 each show a perspective view of an example computer assembly 100 as in FIG. 1, where an air seal 154a, 154b, has been provided to prevent heated air 142 that is drawn down under the motherboard 106 from returning back above the motherboard 106 and being recirculated. In order to better illustrate the seals 154a, 154b, some of the components shown in FIG. 1 are not shown in FIGS. 4 and 5, such as the PCIe card 108 and some expansion slots 120. A seal can comprise, for example, a gasket, a rubber bumper, a plastic wall, and the like. A seal can extend, or fit, between the bottom surface 123 of the motherboard 106 and the side wall 122e of the computer enclosure 102. A seal can be provided, for example, around the air mover 146 as shown in FIG. 4, and/or around the edges of the motherboard 106 as shown in FIG. 5.

Referring to FIG. 4, the seal 154a extends under the motherboard 106 from the opening of the air gap 140 and around the air mover 146. As the air mover 146 draws heated air 142 from above the motherboard 106 through the gap 140 and under the motherboard, the seal 154a around the air mover 146 effectively keeps the heated air from escaping and moving back above the motherboard 106. Instead, the heated air is expelled from the enclosure 102 through the added outlet vent 148 formed in the rear wall 122b of the enclosure 102. The seal 154a creates a cavity under the motherboard 106 that the heated air 142 can be drawn into and expelled from by the air mover 146.

Referring to FIG. 5, the seal 154b extends under the motherboard 106 from the opening of the air gap 140 and all around underneath the motherboard. Thus, the cavity for receiving and expelling heated air is much larger than the cavity discussed with regard to FIG. 4. As the air mover 146 draws heated air 142 from above the motherboard 106 through the gap 140 and under the motherboard, the seal 154b around the edges of the motherboard effectively keeps the heated air from escaping and moving back above the motherboard 106. Instead, the heated air is expelled from the enclosure 102 through the added outlet vent 148 formed in the rear wall 122b of the enclosure 102. The seal 154a creates a cavity under the motherboard 106 that the heated air 142 can be drawn into and expelled from by the air mover 146.

Figure 6:
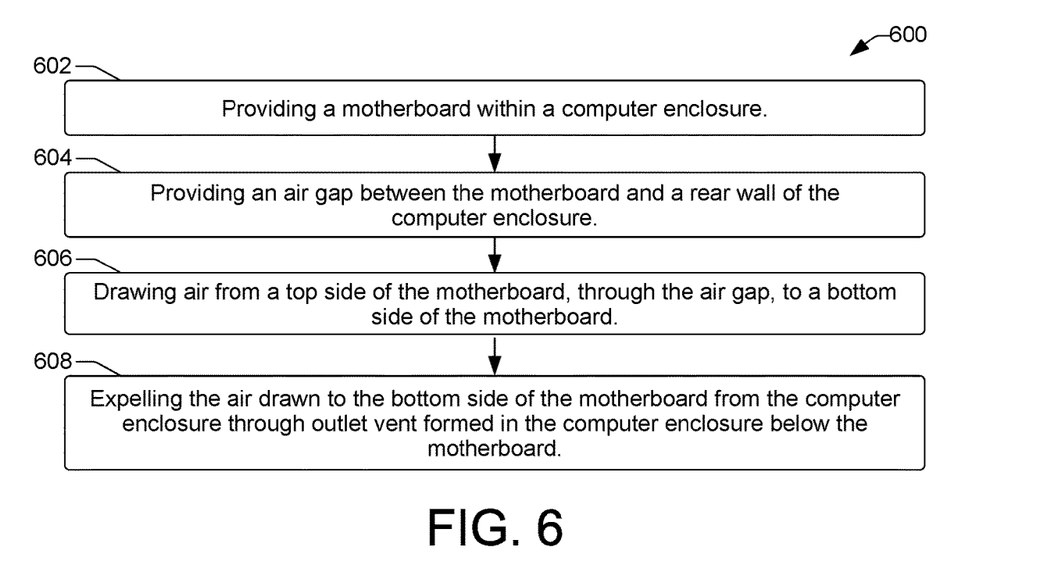
FIGS. 6 and 7 show flow diagrams illustrating example methods of expelling air from a computer assembly.
Figure 7:
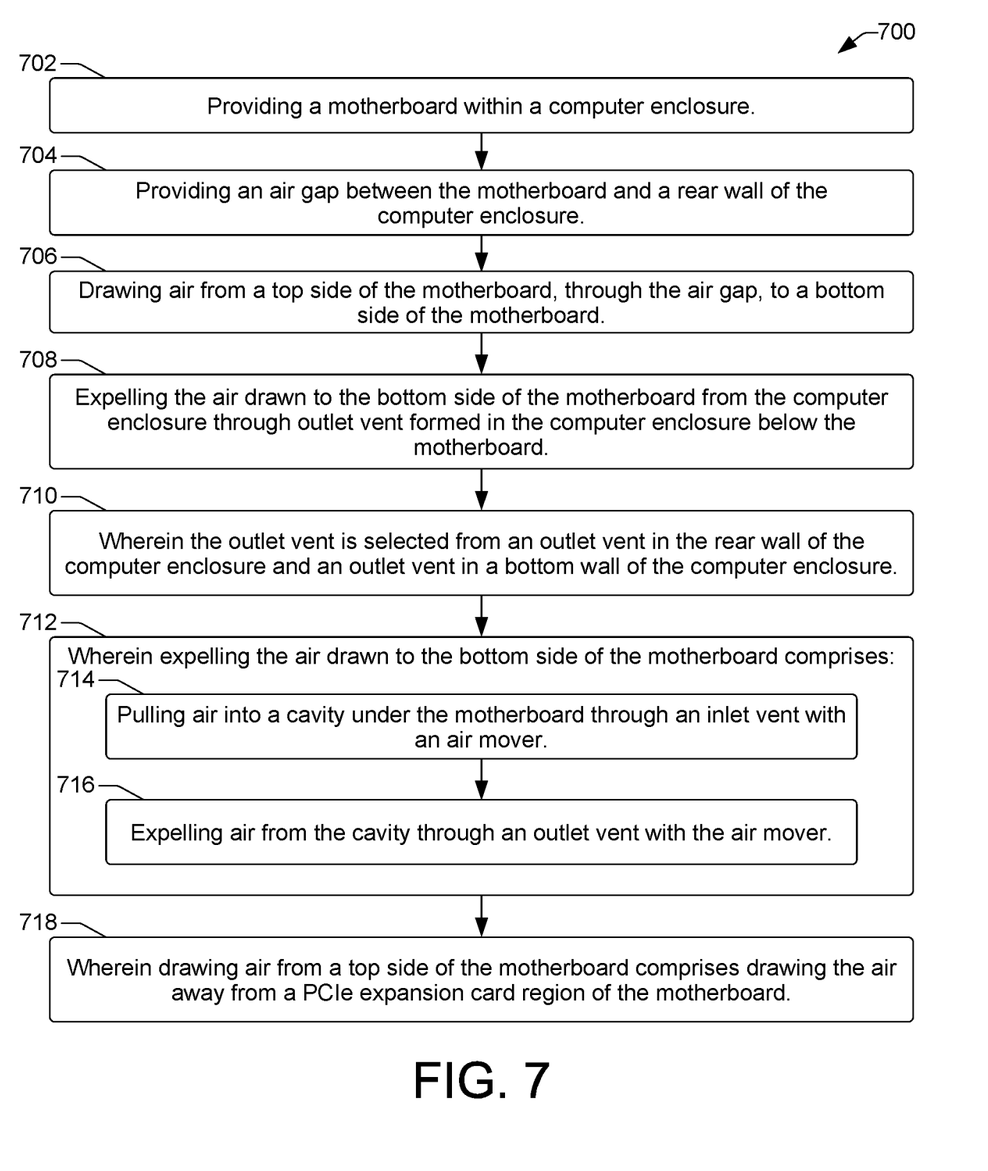

FIGS. 6 and 7 show flow diagrams illustrating example methods 600 and 700, respectively, of expelling air from a computer assembly. Method 700 is an extension of method 600 that incorporates additional details. Methods 600 and 700 are associated with the examples discussed herein with regard to FIGS. 1-5, and details of the operations shown in these methods can be found in the related discussion of such examples. In some examples, methods 600 and 700 may include more than one implementation, and different implementations of methods 600 and 700 may not employ every operation presented in the respective flow diagrams of FIGS. 6 and 7. Therefore, while the operations of methods 600 and 700 are presented in a particular order within the flow diagrams, the order of their presentation is not intended to be a limitation as to the order in which the operations may actually be implemented, or as to whether all of the operations may be implemented. For example, one implementation of method 700 might be achieved through the performance of a number of initial operations, without performing one or more subsequent operations, while another implementation of method 700 might be achieved through the performance of all of the operations.

Referring now to the flow diagram of FIG. 6, an example method 600 of expelling air from a computer assembly begins at block 602 with providing a motherboard within a computer enclosure. The method continues with providing an air gap between the motherboard and a rear wall of the computer enclosure (block 604). The method also includes drawing air from a top side of the motherboard, through the air gap, to a bottom side of the motherboard (block 606), and expelling the air drawn to the bottom side of the motherboard from the computer enclosure through an outlet vent formed in the computer enclosure below the motherboard (block 608).

Referring now to the flow diagram of FIG. 7, another example method 700 of expelling air from a computer assembly is shown. As noted above, method 700 is an extension of method 600 incorporating additional details. Accordingly, like method 600, method 700 can include providing a motherboard within a computer enclosure (block 702). The method continues with providing an air gap between the motherboard and a rear wall of the computer enclosure (block 704). The method also includes drawing air from a top side of the motherboard, through the air gap, to a bottom side of the motherboard (block 706), and expelling the air drawn to the bottom side of the motherboard from the computer enclosure through an outlet vent formed in the computer enclosure below the motherboard (block 708). In some examples, the outlet vent can be selected from an outlet vent in the rear wall of the computer enclosure and an outlet vent in a bottom wall of the computer enclosure (block 710). In some examples, expelling the air drawn to the bottom side of the motherboard (block 712) includes pulling air into a cavity under the motherboard through an inlet vent with an air mover (block 714), and expelling air from the cavity through an outlet vent with the air mover (block 716). In some examples, drawing air from a top side of the motherboard includes drawing the air away from a PCIe expansion card region of the motherboard (block 718).

What is claimed is:

1. A computer assembly comprising:
   a computer enclosure;
   a motherboard with an inset edge section that forms a motherboard air gap between the motherboard and a rear wall of the enclosure when the motherboard is installed in the enclosure;
   a vent opening formed in the enclosure below the motherboard; and,
   an air mover to draw air from above the motherboard, through the air gap, and below the motherboard, and to expel the air drawn below the motherboard from the enclosure through the vent opening.

2. A computer assembly as in claim 1, further comprising:
   a seal to prevent the air drawn below the motherboard from escaping back above the motherboard.

3. A computer assembly as in claim 2, wherein the seal comprises a seal selected from an air mover seal formed around the air mover, and a motherboard seal formed around edges of the motherboard except the inset edge section.

4. A computer assembly as in claim 1, wherein the vent opening formed below the motherboard comprises a vent opening selected from a rear vent opening formed in the rear wall of the enclosure, and a bottom vent opening formed in a bottom wall of the enclosure.

5. A computer assembly as in claim 1, wherein the air mover comprises a centrifugal fan.

6. A method of expelling air from a computer assembly comprising:
   providing a motherboard with an inset edge section within a computer enclosure;
   forming, with the inset edge section, an air gap between the motherboard and a rear wall of the computer enclosure;
   drawing air from a top side of the motherboard, through the air gap, to a bottom side of the motherboard; and,
   expelling the air drawn to the bottom side of the motherboard from the computer enclosure through an outlet vent formed in the computer enclosure below the motherboard.

7. A method as in claim 6, wherein the outlet vent is selected from an outlet vent in the rear wall of the computer enclosure and an outlet vent in a bottom wall of the computer enclosure.

8. A method as in claim 6, wherein expelling the air drawn to the bottom side of the motherboard comprises:
   pulling air into a sealed cavity under the motherboard through an inlet vent with an air mover; and,
   expelling air from the sealed cavity through an outlet vent with the air mover.

9. A method as in claim 6, wherein drawing air from a top side of the motherboard comprises drawing the air away from a PCIe expansion card region of the motherboard.

10. A computer assembly comprising:
    a computer chassis to contain computer components including a motherboard;
    an air gap between the motherboard and a rear wall of the chassis fashioned by an inset section of the motherboard;
    an air mover located underneath the motherboard to draw air from above the motherboard, through the air gap, below the motherboard, and out of the chassis through a chassis outlet vent located below the motherboard.

11. A computer assembly as in claim 10, further comprising:
    a chassis inlet vent located in a bottom wall of the chassis under the air mover, the air mover to draw outside air through the inlet vent into the chassis under the motherboard, and to push the outside air back out of the chassis through the outlet vent.

12. A computer assembly as in claim 10, wherein the outlet vent is located below the motherboard in the rear wall of the chassis.

13. A computer assembly as in claim 10, wherein the outlet vent is located below the motherboard in a bottom wall of the chassis.

14. A computer assembly as in claim 10, wherein the inset section of the motherboard is inset from a rear edge of the motherboard on the order of between 4 to 6 mm.

15. A computer assembly as in claim 10, wherein the air mover is located under the motherboard in a cavity that is sealed except for at the air gap and the outlet vent.

* * * * *